(12) United States Patent
Park

(10) Patent No.: US 11,923,150 B2
(45) Date of Patent: Mar. 5, 2024

(54) DECOUPLING CAPACITORS BASED ON DUMMY THROUGH-SILICON-VIAS

(71) Applicant: Intel Corporation, Santa Clara, CA (US)

(72) Inventor: Changyok Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 16/884,094

(22) Filed: May 27, 2020

(65) Prior Publication Data

US 2021/0375551 A1 Dec. 2, 2021

(51) Int. Cl.
*H01G 4/35* (2006.01)
*H01L 23/522* (2006.01)
*H01L 27/08* (2006.01)
*H01L 49/02* (2006.01)

(52) U.S. Cl.
CPC ........... *H01G 4/35* (2013.01); *H01L 23/5223* (2013.01); *H01L 23/5226* (2013.01); *H01L 27/0805* (2013.01); *H01L 28/60* (2013.01)

(58) Field of Classification Search
CPC .......... H01G 4/35; H01G 4/012; H01G 4/228; H01G 4/33; H01G 4/385; H01L 23/5223; H01L 23/5226; H01L 27/0805; H01L 28/60; H01L 21/76898; H01L 28/92
See application file for complete search history.

(56) References Cited

U.S. PATENT DOCUMENTS

| | | | |
|---|---|---|---|
| 9,385,039 B2 | 7/2016 | Sakuma | |
| 9,536,784 B1 | 1/2017 | Farooq et al. | |
| 9,847,255 B2 | 12/2017 | Lin et al. | |
| 10,181,454 B2 | 1/2019 | Park | |
| 2010/0052099 A1 | 3/2010 | Chang et al. | |
| 2012/0168902 A1 | 7/2012 | Zhu et al. | |
| 2015/0028450 A1* | 1/2015 | Park | H01L 21/76898 257/532 |
| 2018/0158897 A1 | 6/2018 | Gong et al. | |

OTHER PUBLICATIONS

Extended European Search Report in European Patent Application No. EP22150099 dated Jun. 2, 2022. 11 pages.

* cited by examiner

*Primary Examiner* — Karen Kusumakar
*Assistant Examiner* — Adam S Bowen
(74) *Attorney, Agent, or Firm* — Akona IP PC

(57) ABSTRACT

Disclosed herein are IC structures with one or more decoupling capacitors based on dummy TSVs provided in a support structure. An example decoupling capacitor includes first and second capacitor electrodes and a capacitor insulator between them. The first capacitor electrode is a liner of a first electrically conductive material on sidewalls and a bottom of an opening in the support structure, the opening in the support structure extending from the first side towards, but not reaching, the second side. The capacitor insulator is a liner of a dielectric material on sidewalls and a bottom of the opening in the support structure lined with the first electrically conductive material. The second capacitor electrode is a second electrically conductive material filling at least a portion of the opening in the support structure lined with the first electrically conductive material and with the dielectric material.

17 Claims, 15 Drawing Sheets

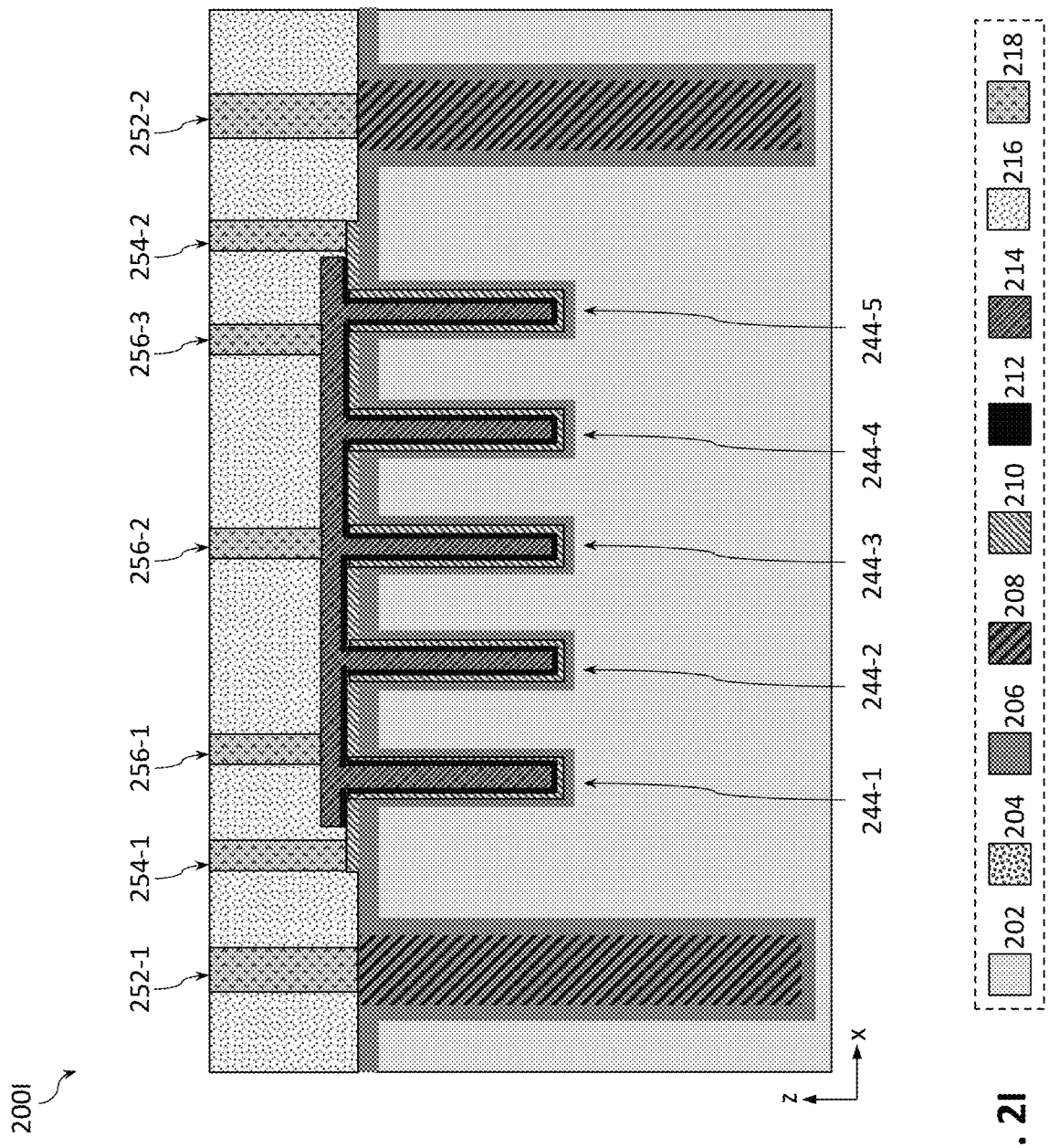

DECOUPLING CAPACITORS BASED ON DUMMY THROUGH-SILICON-VIAS

TECHNICAL FIELD

This disclosure relates generally to the field of integrated circuit (IC) structures and devices, and more specifically, to decoupling capacitors based on dummy through-silicon-vias (TSVs).

BACKGROUND

A decoupling capacitor is a capacitor used to decouple one part of an electrical network from another. Noise caused by other circuit elements can be shunted through the decoupling capacitor, reducing the effect it has on the rest of the circuit.

Decoupling capacitors are typically included in semiconductor packages in order to lower the inductance through the package by reducing the lead length. Decoupling capacitors placed close to power consuming circuits are able to smooth out voltage variation with charges stored on them. The stored charge either dissipates or is used as a local power supply to device inputs during signal switching stages, allowing the decoupling capacitors to negate the effects of voltage noise induced into the system by parasitic inductance. Off-chip decoupling capacitors, however, are not sufficient for very high-speed microprocessor applications. Since the decoupling capacitors are located at a relatively long distance from the switching circuits, the time delay caused by the long inductance path makes the off-chip capacitors unusable with gigahertz switching circuits.

In order to sustain high frequency circuit operation, an ample amount of capacitive decoupling must be provided close to the switching circuits. Although it is possible to integrate chip capacitors within the chip's circuit elements, the capacitors compete for valuable die area that could be used for building additional circuits. Due to the limited area in which to build these capacitors, the overall capacitive decoupling that they provide is also limited.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2J illustrate various stages in the manufacture of an example IC structure according to the method of FIG. 1, in accordance with some embodiments.

DETAILED DESCRIPTION

Overview

Figure 1:
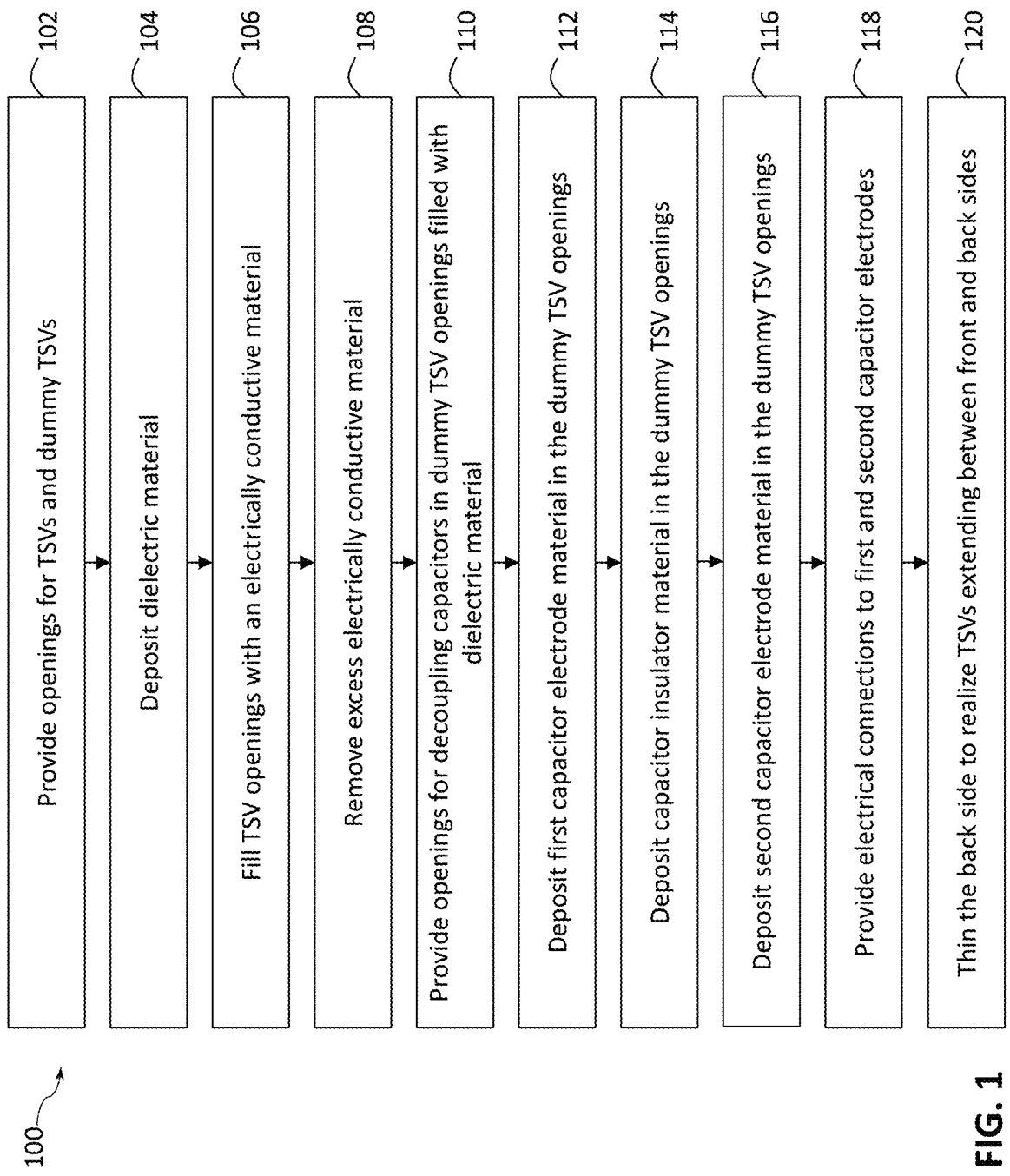
FIG. 1 is a flow diagram of an example method for fabricating decoupling capacitors based on dummy TSVs, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating decoupling capacitors based on dummy TSVs, described herein, it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

ICs commonly include electrically conductive microelectronic structures, which are known in the arts as vias, to electrically connect metal lines or other interconnects above the vias to metal lines or other interconnects below the vias. In this context, the term "metallization stack" may be used to describe a stacked series of electrically insulated metallic interconnecting wires that are used to connect together various devices of an IC, where adjacent layers of the stack are linked together through the use of electrical contacts and vias.

Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer, which may be referred to as a via location opening. Next, an opening for the via may be etched in the dielectric layer by using the location opening in the photoresist layer as an etch mask. This opening in the dielectric layer is referred to as a via opening. Finally, the via opening may be filled with one or more metals or other conductive materials to form the via.

TSVs are a particular type of vias that extend through a support structure such as a substrate, wafer, or a chip. As used herein, the term "dummy TSV" is used to describe an opening that may be formed in the support structure substantially simultaneously with forming openings for the TSVs except that it is designated for other purposes, e.g., for providing decoupling capacitors therein, and except that it does not extend all the way through the support structure.

Disclosed herein are IC structures with one or more decoupling capacitors based on dummy TSVs provided in a support structure. An example decoupling capacitor includes first and second capacitor electrodes and a capacitor insulator between them. The first capacitor electrode is a liner of a first electrically conductive material on sidewalls and a bottom of an opening in the support structure, the opening in the support structure extending from the first side towards, but not reaching, the second side. The capacitor insulator is a liner of a dielectric material on sidewalls and a bottom of the opening in the support structure lined with the first electrically conductive material. The second capacitor electrode is a second electrically conductive material filling at least a portion of the opening in the support structure lined with the first electrically conductive material and with the dielectric material. Such decoupling capacitors may, advantageously, be provided on the same support structures as the TSVs and various IC components.

IC structures as described herein, in particular IC structures with real TSVs and with decoupling capacitors based on dummy TSVs as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 2A-2J, such a collection may be referred to herein without the letters, e.g., as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "high-k dielectric" refers to a material having a higher dielectric constant than silicon oxide while a "low-k dielectric" refers to a material having a lower dielectric constant than silicon oxide. The terms "substantially," "close," "approximately," "near," and "about," generally refer to being within +/−20% of a target value based on the context of a particular value as described herein or as known in the art.

Fabricating IC Structures with Decoupling Capacitors Based on Dummy TSVs

Figure 2A:
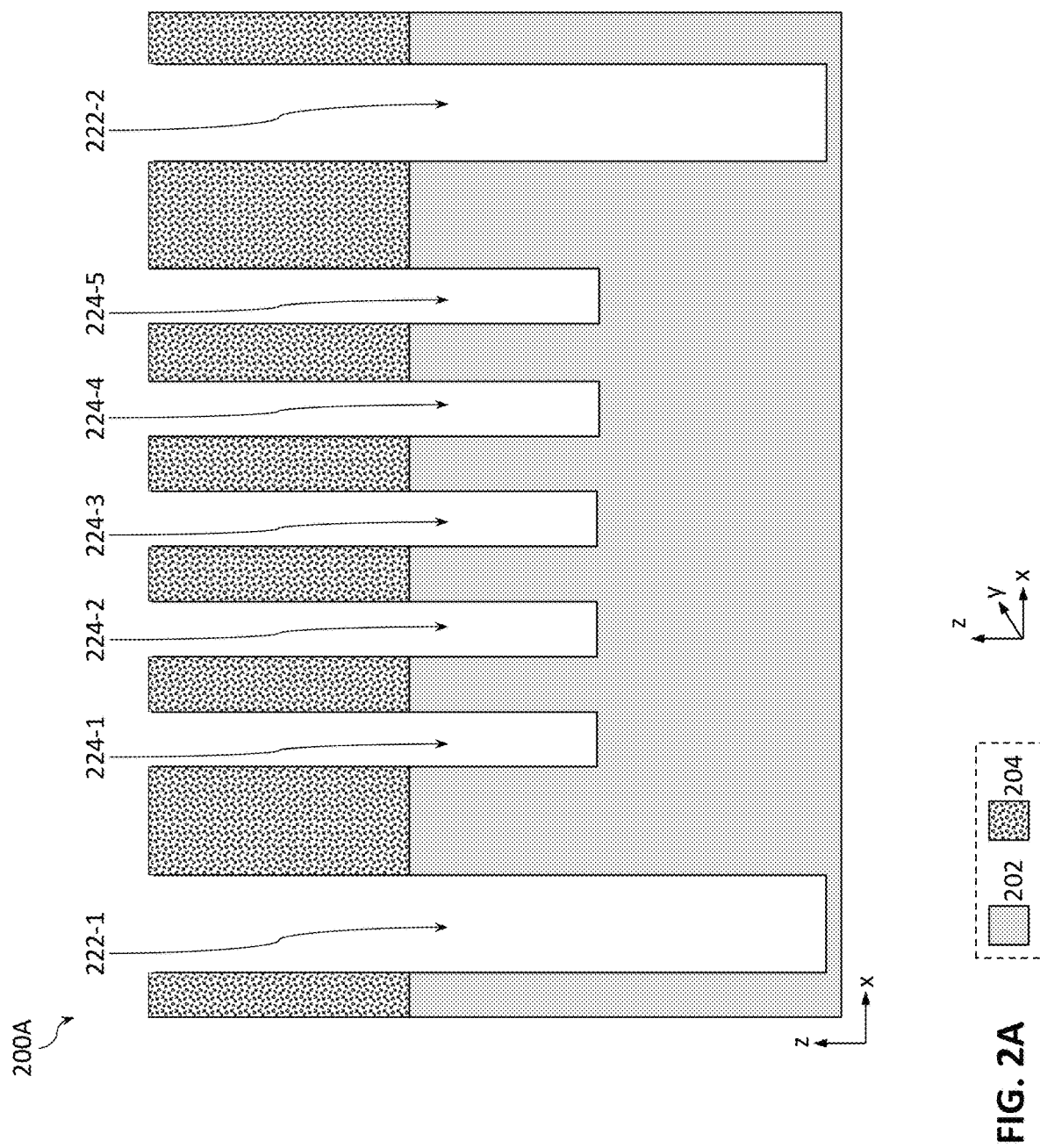

FIG. 1 is a flow diagram of an example method 100 for fabricating decoupling capacitors based on dummy TSVs, in accordance with some embodiments. FIGS. 2A-2J illustrate cross-sectional side views for various stages in the manufacture of an example IC structure 200 (e.g., the IC structure 200A shown in FIG. 2A, 200B shown in FIG. 2B, and so on until 200J shown in FIG. 2J) according to the fabrication method 100, in accordance with some embodiments. In particular, each of FIGS. 2A-2J shows a cross-section side view of the IC structure 200 with the cross-section taken along the x-z plane of the reference coordinate system x-y-z shown in FIG. 2A.

A number of elements referred to in the description of FIGS. 2A-2J with reference numerals are illustrated in these figures with different patterns, with a legend showing the correspondence between the reference numerals and patterns being provided at the bottom of each drawing page containing FIGS. 2A-2J. For example, the legend illustrates that FIGS. 2A-2J use different patterns to show a support structure 202, a dielectric material 206, an electrically conductive material 210, etc. Furthermore, although a certain number of a given element may be illustrated in some of FIGS. 2A-2J (e.g., 2 TSVs and 5 dummy TSVs in between), this is simply for ease of illustration, and more, or less, than that number may be included in an IC structure according to various embodiments of the present disclosure. Still further, various IC structure views shown in FIGS.

2A-2J are intended to show relative arrangements of various elements therein, and that various IC structures, or portions thereof, may include other elements or components that are not illustrated (e.g., transistor portions, various components that may be in electrical contact with any of the TSVs, etc.).

Turning to FIG. 1, the method 100 may begin with a process 102 that includes providing openings for one or more TSVs and one or more dummy TSVs in a support structure. An IC structure 200A, depicted in FIG. 2A, illustrates an example result of the process 102. As shown in FIG. 2A, the IC structure 200A may include a support structure 202 and photoresist 204 provided thereon.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 202 may include any such substrate, possibly with some layers and/or devices already formed thereon, not specifically shown in the present figures, providing a suitable surface for forming the decoupling capacitors based on dummy TSVs therein.

As shown in FIG. 2A, the photoresist 204 has been patterned to have openings through which one or more etchants may be provided to etch the material of the support structure 202 to form openings 222-1 and 222-2 for the TSVs and to form openings 224-1 through 224-5 for the dummy TSVs. Any suitable anisotropic etch process, e.g., a dry etch, may be used in the process 102 to etch the support structure 202 through the openings defined in the photoresist 204. In some embodiments, during the etch of the support structure 202 in the process 102, the IC structure may be heated to elevated temperatures, e.g., to temperatures between about room temperature and 200 degrees Celsius, including all values and ranges therein, to promote that byproducts of the etch are made sufficiently volatile to be removed from the surface.

In some embodiments, the width (a dimension measured along the x-axis of the example coordinate system shown in FIG. 2) of the TSV openings 222 may be between about 100 nanometers and 20 micrometer (TSV opening sizes could hundreds of nm to tens of um), including all values and ranges therein, e.g., between about 500 nanometers and 10 micrometers. In some embodiments, the width of the dummy TSV openings 224 may be between about 250 and 5000 nanometers (pick smaller than TSV, would be 2× of filling dielectric material thickness in this case to use microloading effect and minimize additional process steps), including all values and ranges therein, e.g., between about 100 and 2500 nanometers. In some embodiments, the width of the TSV openings 222 may be between about 1.5 and 10 times greater than the width of the dummy TSV openings 224, including all values and ranges therein, e.g., between about 2 and 5 times greater. Because the width of the TSV openings 222 is larger than that of the dummy TSV openings 224, the TSV openings 222 may be etched further/deeper into the support structure 202 than the dummy TSV openings 224. In some embodiments, the depth (a dimension measured along the z-axis of the example coordinate system shown in FIG. 2) of the TSV openings 222 may be between about 1.1 and 4 times greater than the depth of the dummy TSV openings 224, including all values and ranges therein, e.g., between about 1.5 and 2 times greater. In some embodiments, the depth of the TSV openings 222 may be between about 500 nanometers and 50 micrometers (it could be hundreds of nm to tens of um, for regular TSV it would be few to tens of um, as an example would use 2 and 50 micrometer), including all values and ranges therein, e.g., between about 1 micrometer and 30 micrometers. In some embodiments, the depth of the dummy TSV openings 224 may be between about 250 nanometers and 25 micrometers, including all values and ranges therein, e.g., between about 500 nanometers and 15 micrometers.

The process 102 may conclude with removing the photoresist 204 (not specifically shown in FIGS. 2A-2J).

Figure 2B:
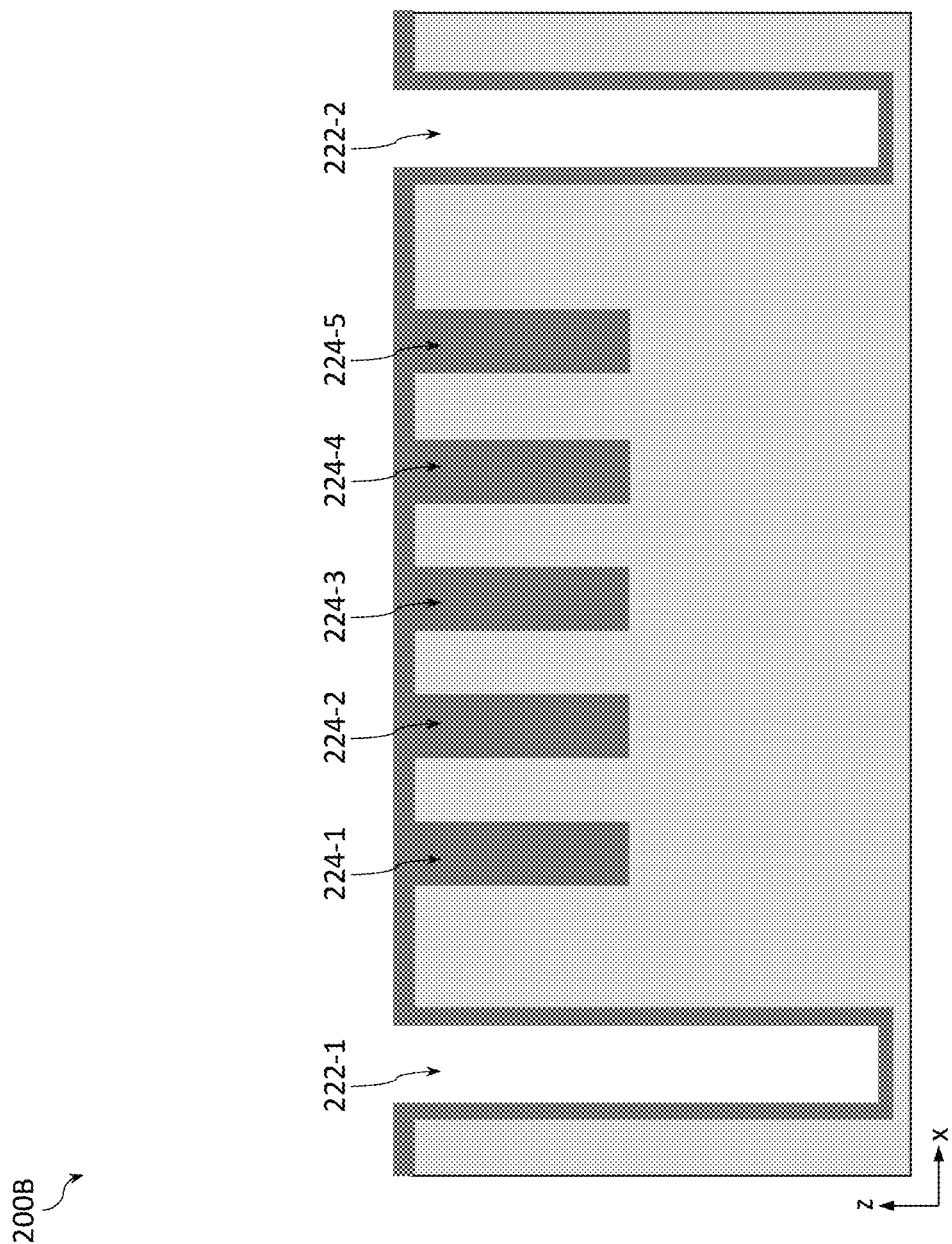

The method 100 may then proceed with a process 104 that includes depositing a layer of a dielectric material into the openings formed in the process 102. A result of this is illustrated with an IC structure 200B, depicted in FIG. 2B, showing a layer of a dielectric material 206 deposited into the openings 222 and 224 formed in the process 102. In some embodiments of the process 104, a liner of the dielectric material 206 may be deposited on sidewalls and bottom of the TSV openings 222 in the process 104 using any suitable techniques for conformally depositing conductive materials onto selected surfaces, such as e.g. atomic layer deposition (ALD), chemical vapor deposition (CVD), plasma enhanced CVD (PECVD), or/and physical vapor deposition (PVD) processes such as e.g. sputter. Because the width of the openings 224 for the future dummy TSVs is smaller than the width of the openings 222 for the TSVs, the dummy TSV openings 224 may be substantially filled with the dielectric material 206, instead of only being lined as is the case for the TSV openings 222. In various embodiments, the dielectric material 206 may include any suitable material for acting as an insulation barrier for the electrically conductive material that will later fill the TSV openings 222. Examples of such materials include, but are not limited to, silicon dioxide and silicon nitride. In some embodiments, the thickness of the dielectric material 206 on the sidewalls and bottoms of the TSV openings 222 may be between about 100 and 7000 nanometers, including all values and ranges therein, e.g., between about 200 and 5000 nanometers.

Figure 2C:
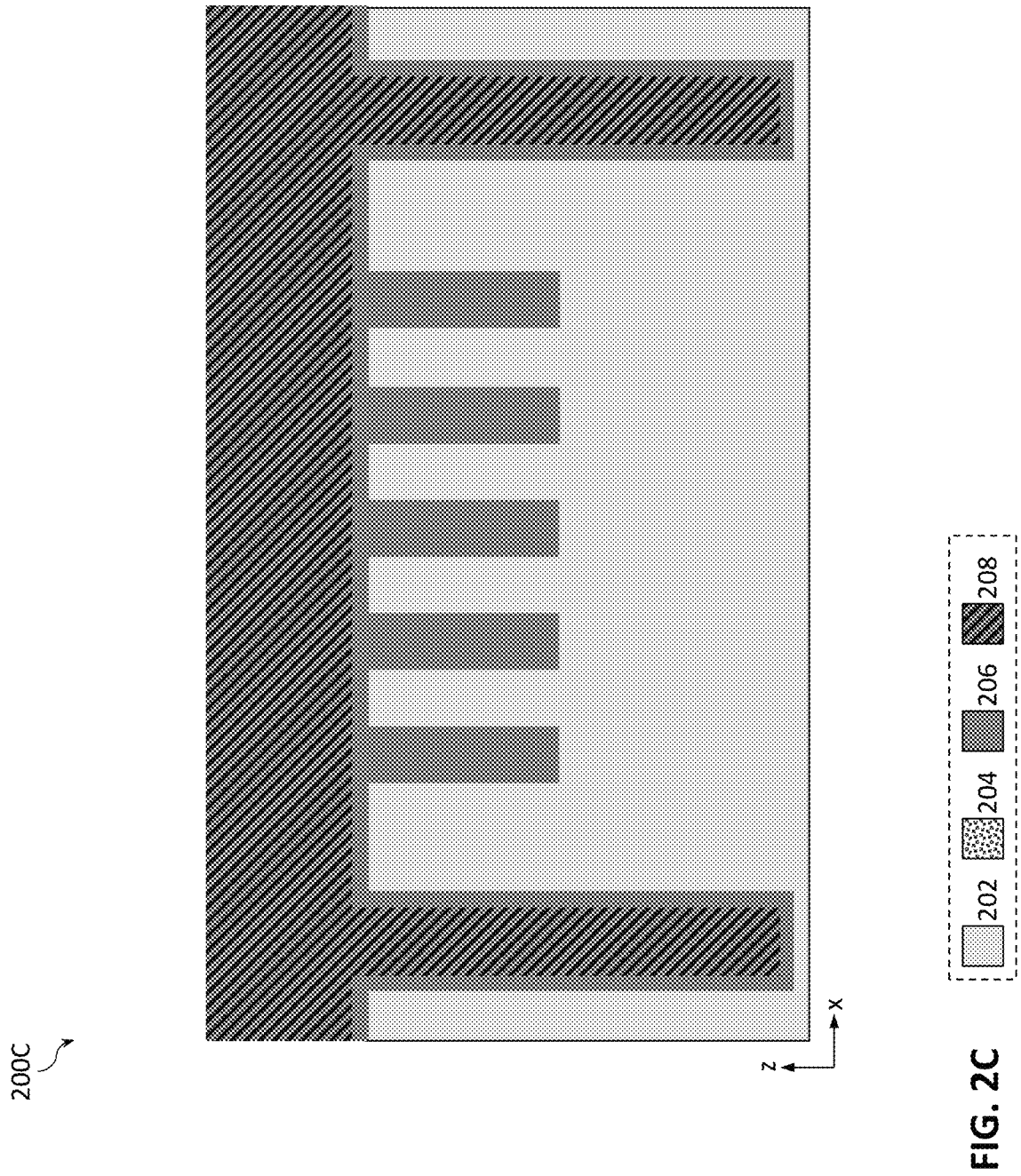
Figure 2D:
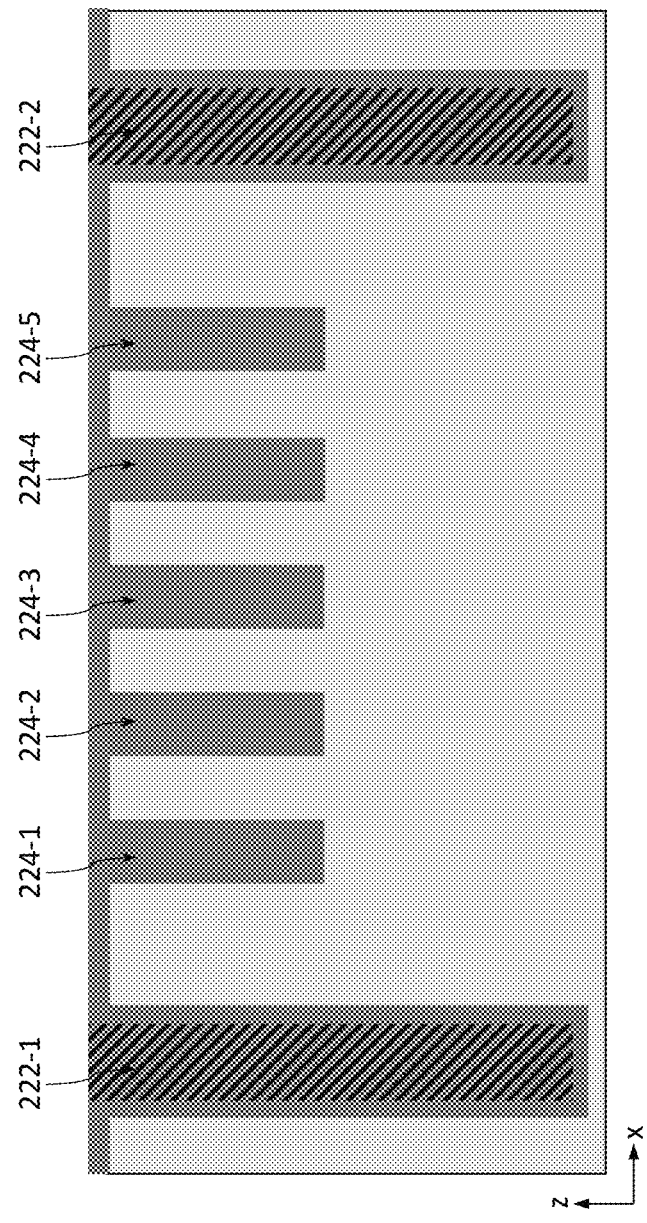

The method 100 may then continue with a process 106 that includes filling the TSV openings 222 lined with the dielectric material 206 with an electrically conductive material. A result of this is illustrated with an IC structure 200C, depicted in FIG. 2C, showing an electrically conductive material 208 provided within the TSV openings 222 of the IC structure 200B, as well as over the upper surface of the IC structure 200B, resulting in the IC structure 200C. The electrically conductive material 208 may be deposited in the process 106 using a deposition technique such as, but not limited to, ALD, CVD, plasma enhanced CVD (PECVD), PVD, or electroplating. In general, various electrically conductive materials described herein, e.g., the electrically conductive material 208 deposited in the process 106, may include one or more of any suitable electrically conductive materials (conductors). Such materials may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, hafnium, zirconium, titanium, tantalum, and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g. hafnium nitride, zirconium nitride, titanium nitride, tantalum nitride, and aluminum nitride) of one or more metals.

Next, the method 100 may include a process 108 that include removing the excess of the electrically conductive material 208 to expose the dielectric material 206 over the upper surface of the IC structure and over the dummy TSV openings 224. A result of this is illustrated with an IC structure 200D, depicted in FIG. 2D. A process of removing excess materials is typically referred to as "planarization." In various embodiments, planarization of the process 108 may be performed using either wet or dry planarization processes. In one embodiment, planarization of the process 108 may be performed using chemical mechanical planarization (CMP), which may be understood as a process that utilizes a polishing surface, an abrasive and a slurry to remove the overburden of the electrically conductive material 208 and planarize the surface of the IC structure 200C to expose the dielectric material 206 and the upper surface of the electrically conductive material 208 within the TSV openings 222.

Figure 2E:
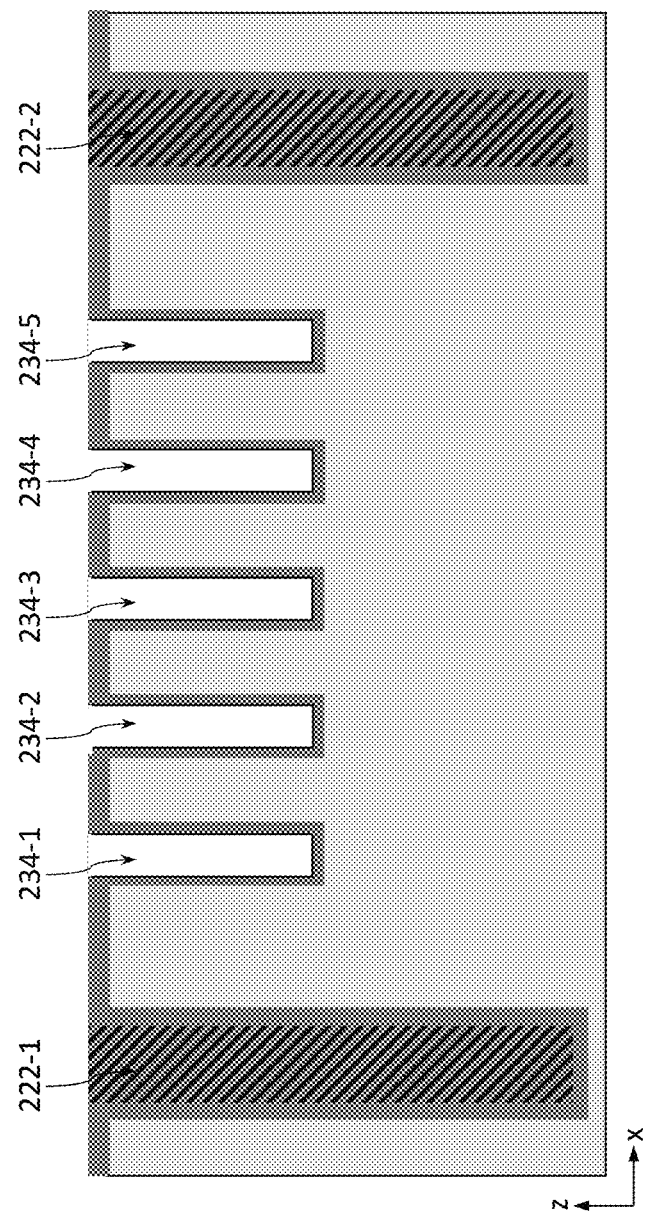

The method 100 may then proceed with a process 110 that includes providing openings for decoupling capacitors in the dummy TSV openings 224 filled with the dielectric material 206. An IC structure 200E, depicted in FIG. 2E, illustrates an example result of the process 110, showing that openings 234-1 through 234-5 may be formed in place of the former dummy TSV openings 224. Any suitable anisotropic etch process, e.g., a dry etch, may be used in the process 110, possibly in combination with patterning (e.g., photolithographic patterning, e-beam lithography, etc.) to remove some or all of the dielectric material 206 from the dummy TSV openings 224. In some embodiments, during the etch of the dielectric material 206 from the dummy TSV openings 224 in the process 110, the IC structure may be heated to elevated temperatures, e.g., to temperatures between about room temperature and 200 degrees Celsius, including all values and ranges therein, to promote that byproducts of the etch are made sufficiently volatile to be removed from the surface.

In various embodiments, the width of the openings 234 may be either slightly smaller than the width of the dummy TSV openings 224 (in case some of the dielectric material 206 remains on the sidewalls and the bottoms of the dummy TSV openings 224, as is shown with the example of FIG. 2E and the subsequent FIGS. 2F-2I) or the same (in case all of the dielectric material 206 is removed from the dummy TSV openings 224, not specifically shown in the present drawings). As shown in the example of FIG. 2E, in some embodiments, a liner of the dielectric material 206 may remain in the dummy TSV openings 234 after some of the dielectric material 206 has been removed from their center. The thickness of such liner may be as described above with reference to the liner of the dielectric material 206 in the TSV openings 222. In other embodiments, the openings 234 may be substantially identical with the openings 224 (i.e., no liner of the dielectric material 206).

Figure 2F:
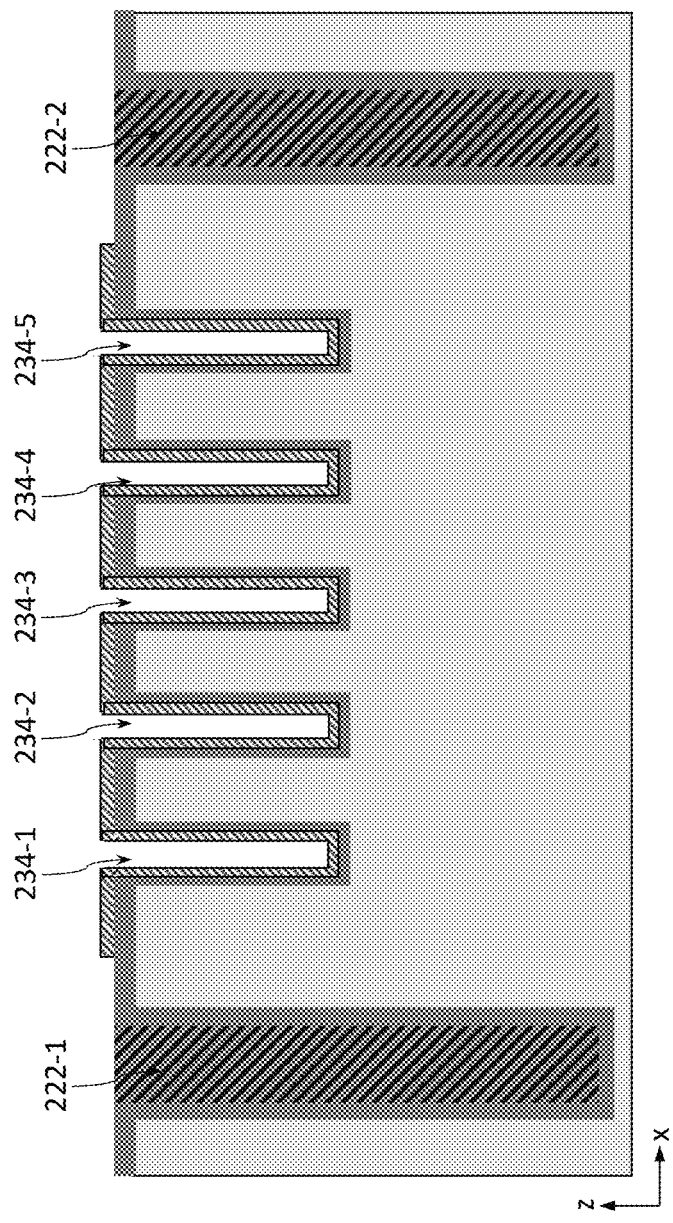

The method 100 may then continue with a process 112 that includes depositing a first capacitor electrode material as a liner that lines the sidewalls and bottoms of the dummy TSV openings 234. A result of this is illustrated with an IC structure 200F, depicted in FIG. 2F, showing a first capacitor electrode material 210 lining the inner surfaces of the dummy TSV openings 234 and extending a little bit over the upper surface of the IC structure 200F. In various embodiments, the first capacitor electrode material 210 may include any of the electrically conductive materials described above, and may be deposited in the process 112 using any conformal deposition processes described above, possibly in combination with lithographic patterning. In some embodiments, a thickness of the first capacitor electrode material 210 on the sidewalls and bottoms of the dummy TSV openings 234 may be between about 10 and 70 nanometers, including all values and ranges therein, e.g., between about 20 and 50 nanometers.

Figure 2G:
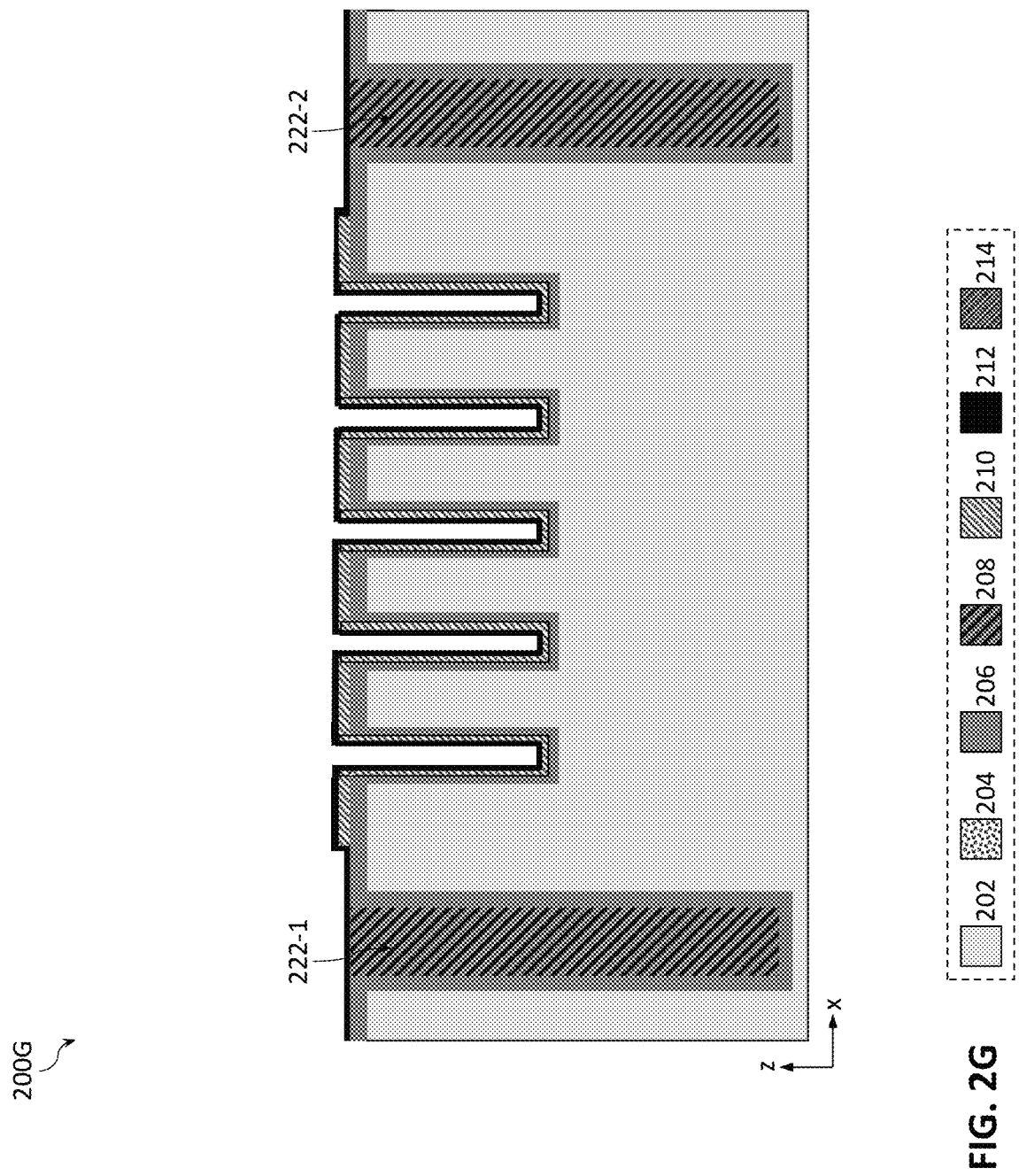

The method 100 may then continue with a process 114 that includes depositing a capacitor insulator material as a liner that lines the sidewalls and bottoms of the dummy TSV openings 234 lined with the first capacitor electrode material 210. A result of this is illustrated with an IC structure 200G, depicted in FIG. 2G, showing a capacitor insulator material 212 lining the inner surfaces of the dummy TSV openings 234 lined with the first capacitor electrode material 210. FIG. 2G also illustrates that the capacitor insulator material 212 may be deposited uniformly over the IC structure 200F, resulting in a layer of the capacitor insulator material 212 also being provided over the upper surfaces of the IC structure 200F.

In some embodiments, the capacitor insulator material 212 may be deposited in the process 114 using any suitable deposition technique such as, but not limited to, spin-coating, dip-coating, ALD, PVD, or CVD. In various embodiments, the capacitor insulator material 212 may include one or more materials typically used as an interlayer dielectric (ILD). For example, a layer of the capacitor insulator material 212 may be formed using dielectric materials known for their applicability in ICs, such as low-k dielectric materials. Examples of dielectric materials that may be used as the capacitor insulator material 212 may include, but are not limited to, silicon dioxide (SiO2), carbon-doped oxide (CDO), silicon nitride, fluorosilicate glass (FSG), silicon nitride, and organosilicates such as silsesquioxane, siloxane, or organosilicate glass. In some embodiments, the capacitor insulator material 212 may include organic polymers such as polyimide, polynorbornenes, benzocyclobutene, perfluorocyclobutane, or polytetrafluoroethylene (PTFE). Still other examples of low-k dielectric materials that may be used as the capacitor insulator material 212 include silicon-based polymeric dielectrics such as hydrogen silsesquioxane (HSQ) and methylsilsesquioxane (MSQ). In some embodiments, a thickness of the capacitor insulator material 212 deposited in the process 114 may be between about 1 and 7 nanometers, including all values and ranges therein, e.g., between about 2 and 5 nanometers.

Figure 2H:
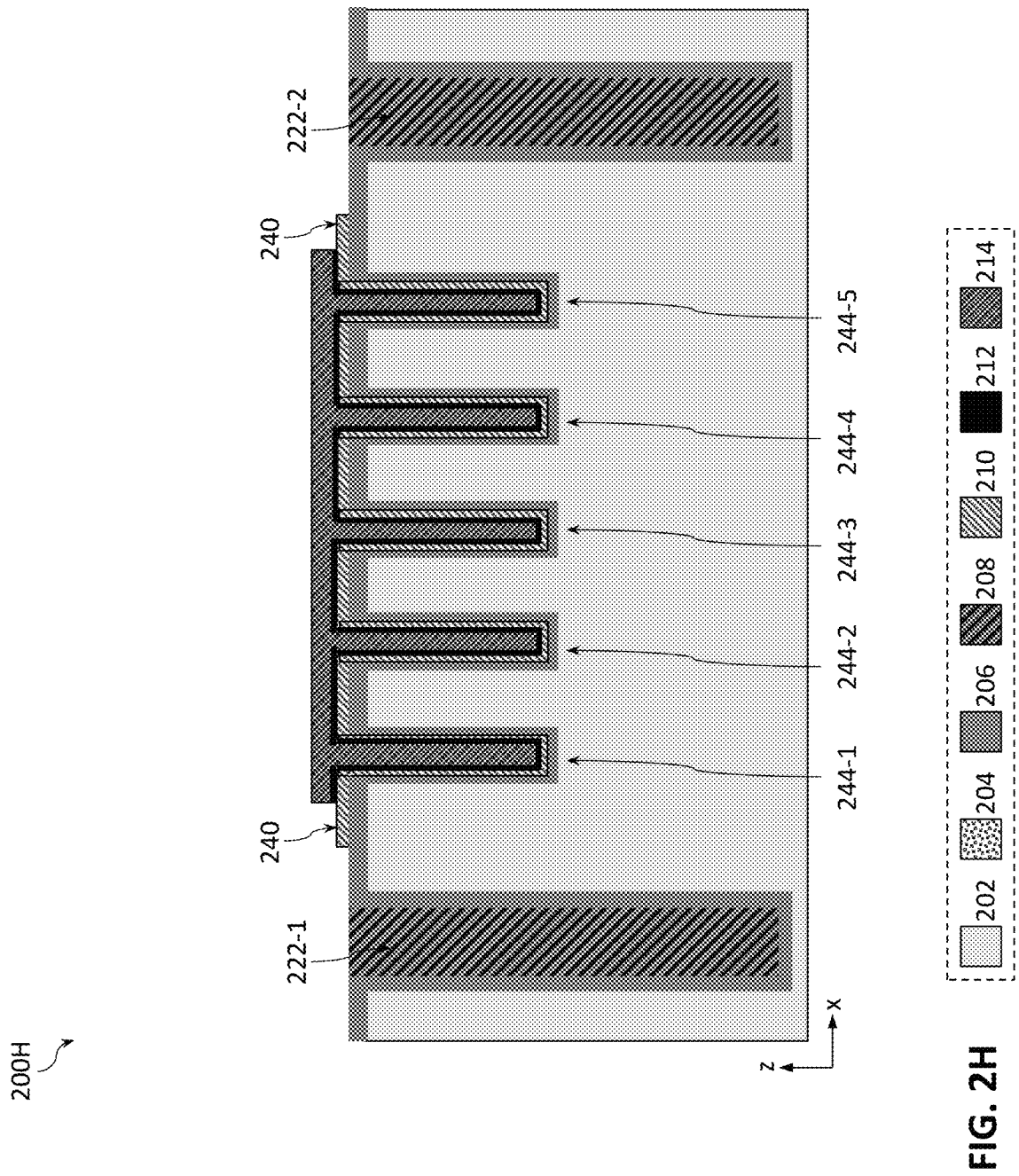

The method 100 may then continue with a process 116 that includes depositing a second capacitor electrode material within the remainder of the dummy TSV openings 234 after they have been lined with the first capacitor electrode material 210 and the capacitor insulator material 212. A result of this is illustrated with an IC structure 200H, depicted in FIG. 2H, showing a second capacitor electrode material 214 filling the remainder of the dummy TSV openings 234. In various embodiments, the second capacitor electrode material 214 may include any of the electrically conductive materials described above, and may be deposited in the process 116 using any suitable deposition processes such as ALD, CVD, plasma enhanced CVD (PECVD), PVD, or electroplating. In some embodiments, the first capacitor electrode material 210 and the second capacitor electrode material 214 may have substantially the same material composition. In other embodiments, material compositions of the first capacitor electrode material 210 and the second capacitor electrode material 214 may be different. In some embodiments, the process 116 may further include removing one or more portions of the capacitor insulator material 210 and the second capacitor electrode material 214 to expose one or more portions of the first capacitor electrode material 210 (shown in FIG. 2H as portions 240), so that electrical contacts to those portions may be made in the subsequent process.

The first capacitor electrode material 210 and the second capacitor electrode material 214 with the capacitor insulator material 212 therebetween within the dummy TSV openings 234 form decoupling capacitors 244. Thus, FIG. 2H illustrates 5 such decoupling capacitors, 244-1 through 244-5. In such decoupling capacitors, the first capacitor electrode is formed by the first capacitor electrode material 210, the second capacitor electrode is formed by the second capacitor electrode material 214, and the capacitor insulator/dielectric is formed by the capacitor insulator material 212.

Optionally, the method 100 may also include a process 118 that includes providing electrical connections (interconnects) to the first and second capacitor electrodes of the decoupling capacitors 244. A result of this is illustrated with an IC structure 200I, depicted in FIG. 2I, showing interconnects 252 for providing electrical connectivity to the electrically conductive material 208 in the TSV openings 222, interconnects 254 for providing electrical connectivity to the first capacitor electrode of the decoupling capacitors 244, and further showing interconnects 256 for providing electrical connectivity to the second capacitor electrode of the decoupling capacitors 244. The interconnects 252, 254, and 256 may be formed of an electrically conductive material 218, which may include any of the electrically conductive materials described above, and may be provided within a layer of a dielectric material 216, which may include any of the dielectric/ILD materials described above. In other embodiments, the number and the locations of any of the interconnects 252, 254, and 256 may be different from what is shown in FIG. 2I.

Figure 2J:
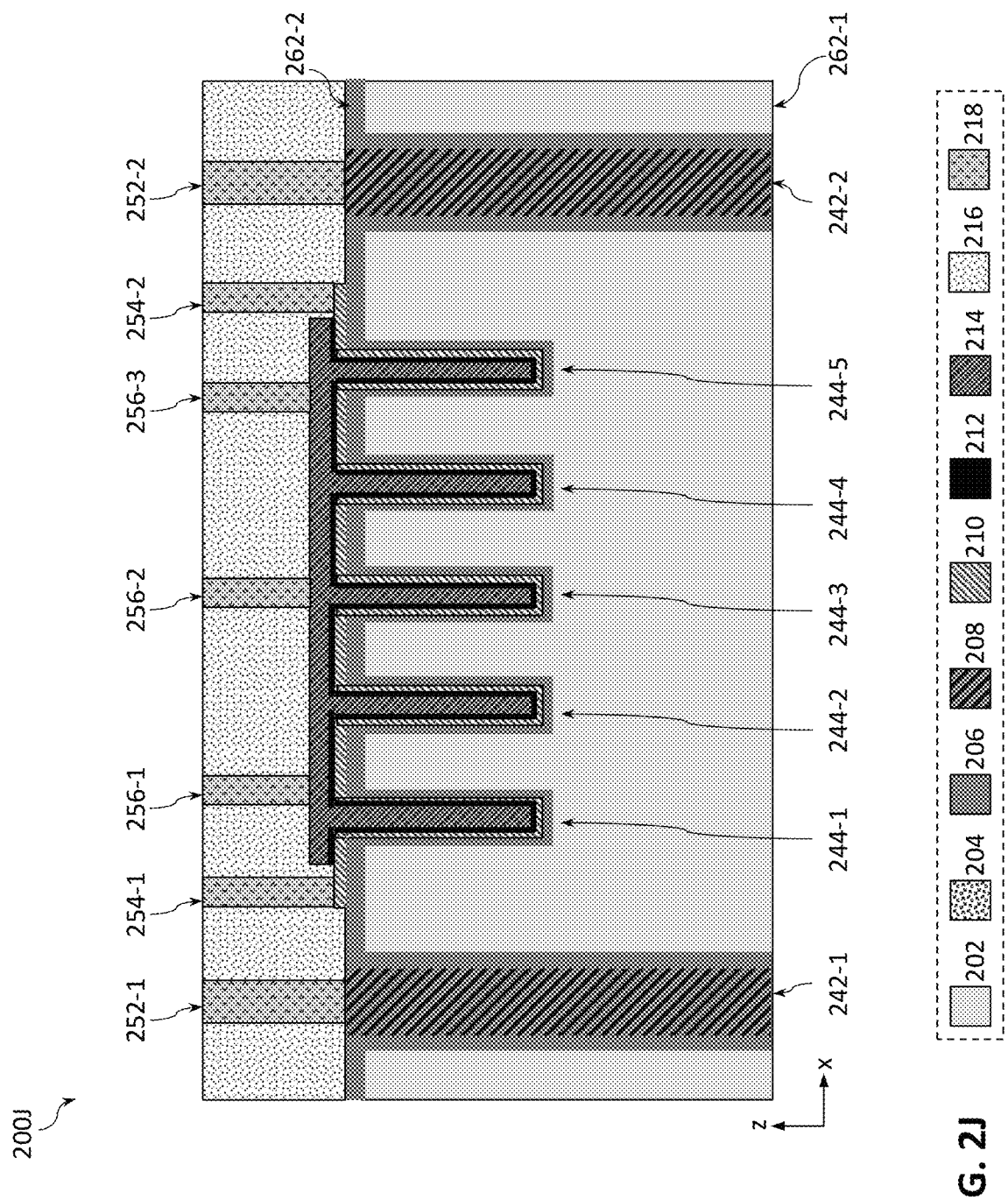

The method 100 may conclude with a process 120 that includes thinning the back side of the support structure 202 to realize TSVs that extend between front and back sides of the support structure 202. A result of this is illustrated with an IC structure 200J, depicted in FIG. 2J, showing that the back side 262-1 may be thinned until the electrically conductive material 208 is exposed (i.e., is at the surface of the back side 262-1) so that an electrical connection may be made thereto, thus realizing TSVs 242.

Example Devices

The IC structures with decoupling capacitors based on dummy TSVs disclosed herein may be included in any suitable electronic device. FIGS. 3-6 illustrate various examples of apparatuses that may include one or more of the IC structures disclosed herein.

Figure 3B:
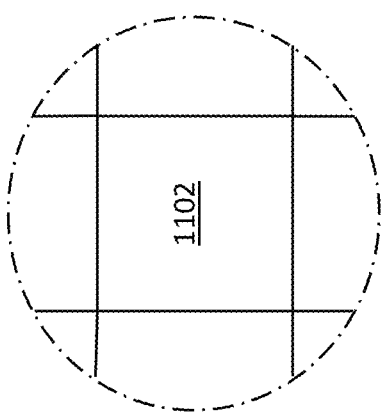
FIGS. 3A and 3B are top views of a wafer and dies that include one or more IC structures with decoupling capacitors based on dummy TSVs in accordance with any of the embodiments disclosed herein.
Figure 3A:
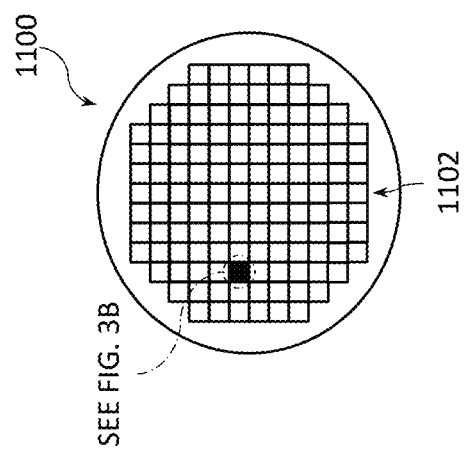

FIGS. 3A and 3B are top views of a wafer and dies that include one or more IC structures with one or more decoupling capacitors based on dummy TSVs in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC structure (e.g., the IC structure 200J as shown in FIG. 2J, or any further embodiments of the IC structure 200). After the fabrication of the semiconductor product is complete (e.g., after manufacture of one or more IC structures with one or more decoupling capacitors based on dummy TSVs as described herein, included in a particular electronic component, e.g., in a transistor or in a memory device), the wafer 1100 may undergo a singulation process in which each of the dies 1102 is separated from one another to provide discrete "chips" of the semiconductor product. In particular, devices that include one or more IC structures with one or more decoupling capacitors based on dummy TSVs as disclosed herein may take the form of the wafer 1100 (e.g., not singulated) or the form of the die 1102 (e.g., singulated). The die 1102 may include one or more transistors (e.g., one or more of the transistors 1240 of FIG. 4, discussed below) and/or supporting circuitry to route electrical signals to the transistors, as well as any other IC components (e.g., one or more IC structures with one or more decoupling capacitors based on dummy TSVs as discussed herein). In some embodiments, the wafer 1100 or the die 1102 may include a memory device (e.g., a static random access memory (SRAM) device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 6) or other logic that is configured to store information in the memory devices or execute instructions stored in the memory array.

Figure 4:
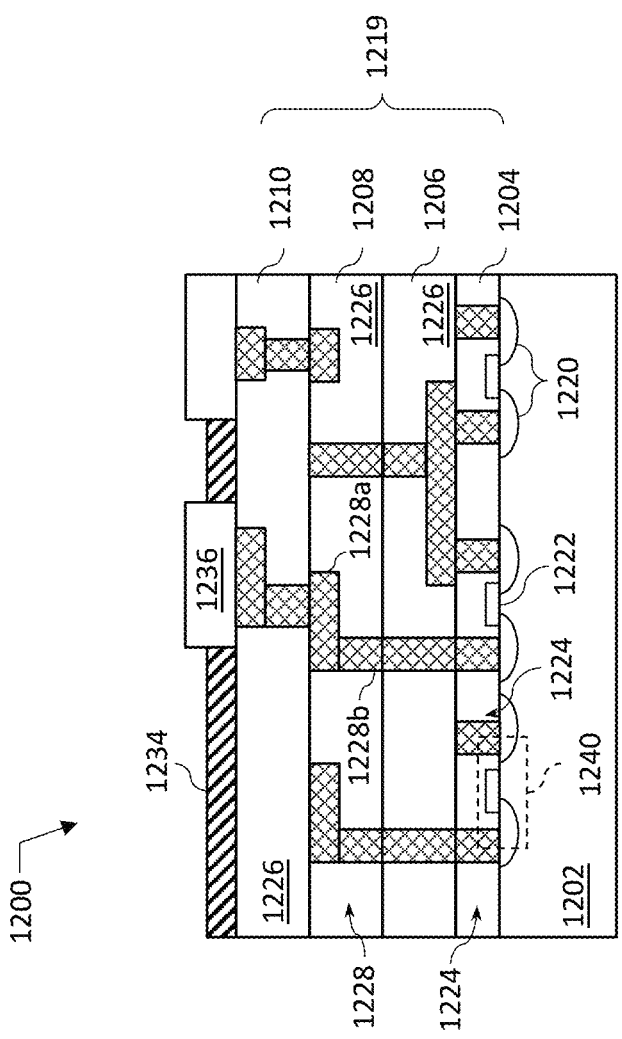
FIG. 4 is a cross-sectional side view of an IC device that may include one or more IC structures with decoupling capacitors based on dummy TSVs in accordance with any of the embodiments disclosed herein.

FIG. 4 is a cross-sectional side view of an IC device 1200 that may include one or more IC structures with one or more decoupling capacitors based on dummy TSVs in accordance with any of the embodiments disclosed herein. The IC device 1200 may be formed on a substrate 1202 (e.g., the wafer 1100 of FIG. 3A) and may be included in a die (e.g., the die 1102 of FIG. 3B). The substrate 1202 may be any substrate as described herein. The substrate 1202 may be part of a singulated die (e.g., the dies 1102 of FIG. 3B) or a wafer (e.g., the wafer 1100 of FIG. 3A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1240 may include a gate 1222 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 1240 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 4, the IC device 1200 may include one or more decoupling capacitors based on dummy TSVs at any suitable location in the IC device 1200.

The S/D regions 1220 may be formed within the substrate 1202 adjacent to the gate 1222 of each transistor 1240, using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220. In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 4 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1410 may form an ILD stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 4). Although a particular number of interconnect layers 1206-1210 is depicted in FIG. 4, embodiments of the present disclosure include IC devices having more or fewer interconnect layers than depicted.

In some embodiments, the interconnect structures 1228 may include trench contact structures 1228a (sometimes referred to as "lines") and/or via structures 1228b (sometimes referred to as "holes") filled with an electrically conductive material such as a metal. The trench contact structures 1228a may be arranged to route electrical signals in a direction of a plane that is substantially parallel with a surface of the substrate 1202 upon which the device layer 1204 is formed. For example, the trench contact structures 1228a may route electrical signals in a direction in and out of the page from the perspective of FIG. 4. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench contact structures 1228a of different interconnect layers 1206-1210 together.

The interconnect layers 1206-1210 may include a dielectric material 1226 disposed between the interconnect structures 1228, as shown in FIG. 4. The dielectric material 1226 may take the form of any of the embodiments of the dielectric material provided between the interconnects of any of the IC structures disclosed herein, for example any of the embodiments discussed herein with reference to the dielectric material 212 or 216, described herein.

In some embodiments, the dielectric material 1226 disposed between the interconnect structures 1228 in different ones of the interconnect layers 1206-1210 may have different compositions. In other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench contact structures 1228a and/or via structures 1228b, as shown. The trench contact structures 1228a of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228b to couple the trench contact structures 1228a of the second interconnect layer 1208 with the trench contact structures 1228a of the first interconnect layer 1206. Although the trench contact structures 1228a and the via structures 1228b are structurally delineated with a line within each interconnect layer (e.g., within the second interconnect layer 1208) for the sake of clarity, the trench contact structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 5:
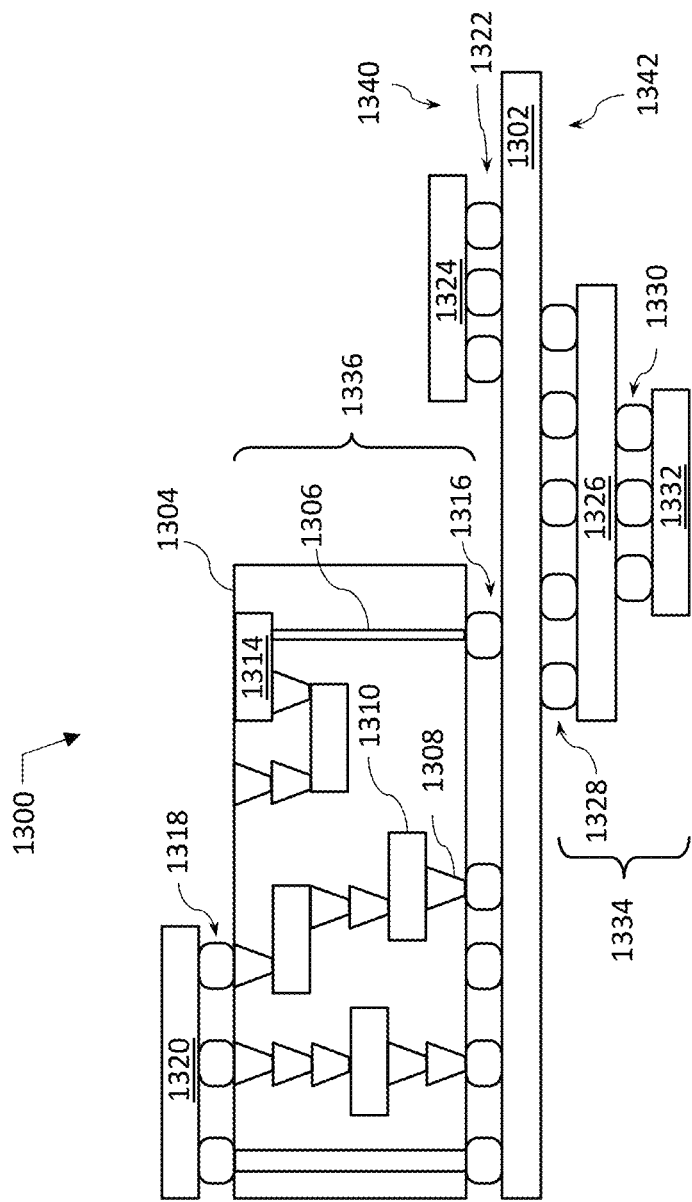
FIG. 5 is a cross-sectional side view of an IC device assembly that may include one or more IC structures with decoupling capacitors based on dummy TSVs in accordance with any of the embodiments disclosed herein.

FIG. 5 is a cross-sectional side view of an IC device assembly 1300 that may include components having or being associated with (e.g. being electrically connected by means of) one or more IC structures with decoupling capacitors based on dummy TSVs in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the decoupling capacitors based on dummy TSVs, disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 5 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 5), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 5, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 3B), an IC device (e.g., the IC device 1200 of FIG. 4), or any other suitable component. In some embodiments, the IC package 1320 may include one or more decoupling capacitors based on dummy TSVs, as described herein. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 5, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1304. The interposer 1304 may further include one or more decoupling capacitors based on dummy TSVs, as described herein. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 5 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 6:
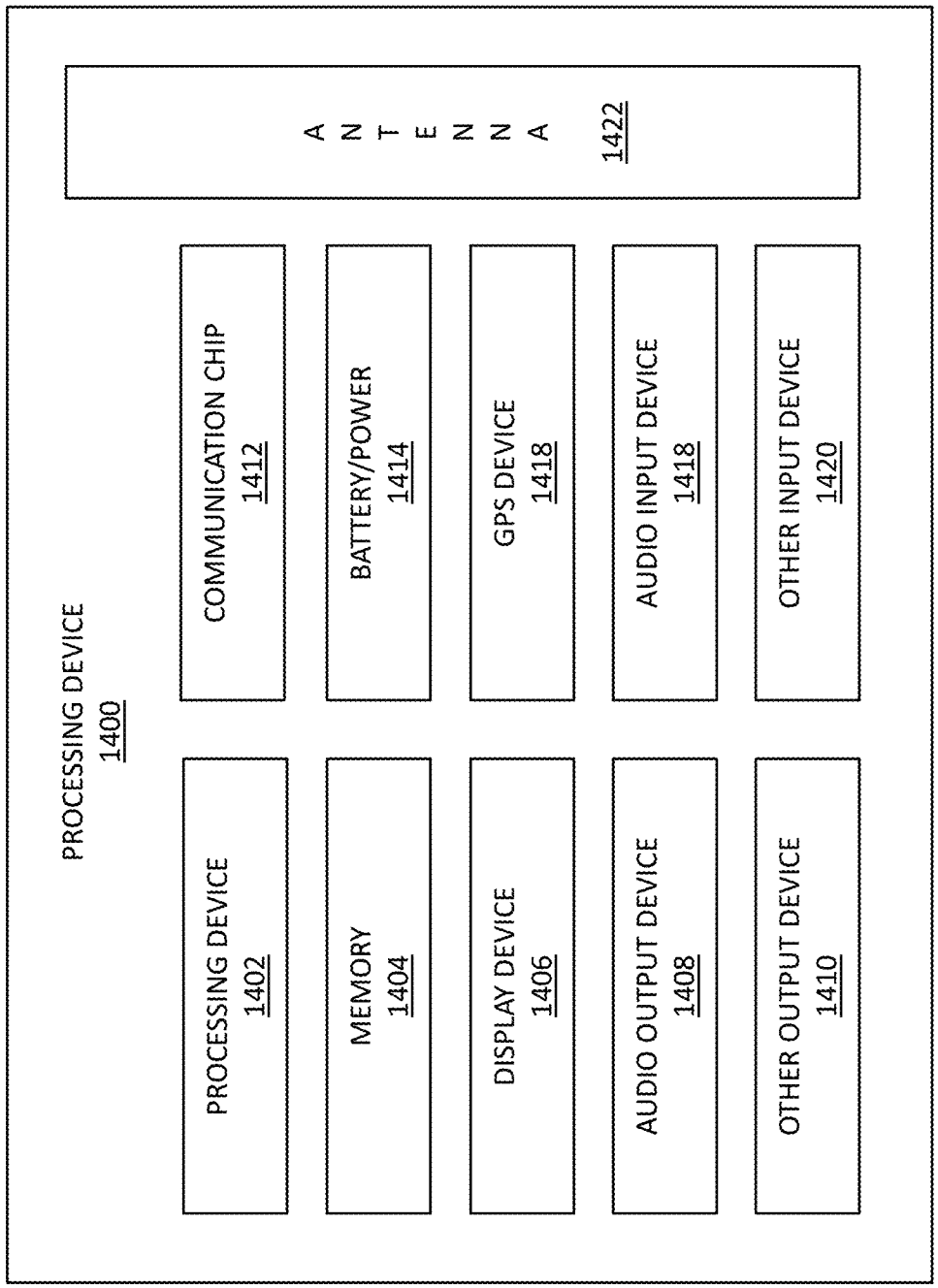
FIG. 6 is a block diagram of an example computing device that may include one or more IC structures with decoupling capacitors based on dummy TSVs in accordance with any of the embodiments disclosed herein.

FIG. 6 is a block diagram of an example computing device 1400 that may include one or more components including one or more IC structures with one or more decoupling capacitors based on dummy TSVs in accordance with any of the embodiments disclosed herein. For example, any suitable ones of the components of the computing device 1400 may include a die (e.g., the die 1102 of FIG. 3B) having one or more decoupling capacitors based on dummy TSVs as described herein. Any one or more of the components of the computing device 1400 may include, or be included in, an IC device 1200 (FIG. 4). Any one or more of the components of the computing device 1400 may include, or be included in, an IC device assembly 1300 (FIG. 5).

A number of components are illustrated in FIG. 6 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 6, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408, but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-MRAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

Select Examples

The following paragraphs provide various examples of the embodiments disclosed herein.

Example 1 provides an IC structure that includes a support structure (e.g., a substrate), having a first side (262-1) and a second side (262-2), opposite the first side; a through-silicon via (TSV) (242-1 or 242-2), extending between the first side and the second side; and a decoupling capacitor having a first capacitor electrode, a second capacitor electrode, and a capacitor insulator between the first capacitor electrode and the second capacitor electrode. In such an IC structure, the first capacitor electrode is a liner of a first electrically conductive material on sidewalls and a bottom of an opening in the support structure, the opening in the support structure extending from the second side towards, but not reaching, the first side; the capacitor insulator is a liner of a capacitor insulator material on sidewalls and a bottom of the opening in the support structure lined with the first electrically conductive material; and the second capacitor electrode is a second electrically conductive material filling at least a portion of the opening in the support structure lined with the first electrically conductive material and with the capacitor insulator material.

Example 2 provides the IC structure according to example 1, where a depth of the opening in the support structure is between about 1 and 25 micrometers.

Example 3 provides the IC structure according to examples 1 or 2, a depth of the opening in the support structure is between about 1.1 and 4 times smaller than a distance between the first side and the second side.

Example 4 provides the IC structure according to any one of the preceding examples, where a width of the opening in the support structure is between about 250 and 5000 nanometers.

Example 5 provides the IC structure according to any one of the preceding examples, where a thickness of the liner of the first electrically conductive material is between about 10 and 70 nanometers.

Example 6 provides the IC structure according to any one of the preceding examples, where a thickness of the liner of the capacitor insulator material is between about 1 and 7 nanometers.

Example 7 provides the IC structure according to any one of the preceding examples, further including a first interconnect coupled to the first capacitor electrode, and a second interconnect coupled to the second capacitor electrode.

Example 8 provides the IC structure according to any one of the preceding examples, further including a liner of a dielectric material between the first electrically conductive material and the sidewalls and the bottom of an opening in the support structure.

Example 9 provides the IC structure according to example 8, where a thickness of the liner of the dielectric material is between about 100 and 7000 nanometers.

Example 10 provides the IC structure according to examples 8 or 9, further including a liner of the dielectric material on sidewalls and a bottom of the TSV.

Example 11 provides the IC structure according to any one of examples 8-10, where the dielectric material is silicon oxide or silicon nitride.

Example 12 provides the IC structure according to any one of the preceding examples, where the capacitor insulator material includes one or more of hafnium oxide, silicon oxide, silicon nitride, silicon oxynitride, silicon oxycarbide nitride, silicon oxycarbide, titanium oxide, zirconium oxide, tin oxide, aluminum oxide, silicon nitride, and aluminum nitride.

Example 13 provides an IC package that includes an IC die having a first side (262-1) and a second side (262-2), opposite the first side; and a further IC component, coupled to the IC die. In such an IC package, a through-silicon via (TSV) (242-1 or 242-2) extends between the first side and the second side; the IC die includes a decoupling capacitor having a first capacitor electrode, a second capacitor electrode, and a capacitor insulator between the first capacitor electrode and the second capacitor electrode; the first capacitor electrode is a liner of a first electrically conductive material on sidewalls and a bottom of an opening in the IC die, the opening in the IC die extending from the second side towards, but not reaching, the first side of the IC die; the capacitor insulator is a liner of a capacitor insulator material on sidewalls and a bottom of the opening in the IC die lined with the first electrically conductive material; the second capacitor electrode is a second electrically conductive material filling at least a portion of the opening in the IC die lined with the first electrically conductive material and with the capacitor insulator material; and the TSV at least partially filled with a third electrically conductive material.

Example 14 provides the IC package according to example 13, a depth of the opening in the IC die is between about 1.1 and 4 times smaller than a distance between the first side and the second side of the IC die.

Example 15 provides the IC package according to examples 13 or 14, where the further component is one of a package substrate, a flexible substrate, or an interposer.

Example 16 provides the IC package according to any one of examples 13-15, where the further component is coupled to the IC die via one or more first level interconnects.

Example 17 provides the IC package according to example 16, where the one or more first level interconnects include one or more solder bumps, solder posts, or bond wires.

Example 18 provides a method for fabricating an IC structure. The method includes providing, in a support structure, an opening for a TSV and an opening for a decoupling capacitor, where a depth of the opening for the decoupling capacitor is between about 1.1 and 4 times smaller than a depth of the opening for the TSV; providing a first capacitor electrode of the decoupling capacitor as a liner of a first electrically conductive material on sidewalls and a bottom of the opening for the decoupling capacitor; providing a capacitor insulator of the decoupling capacitor as a liner of a capacitor insulator material on sidewalls and a bottom of the opening for the decoupling capacitor lined with the first electrically conductive material; providing a second capacitor electrode of the decoupling capacitor by providing a second electrically conductive material filling at least a portion of the opening for the decoupling capacitor lined with the first electrically conductive material and with the capacitor insulator material; and providing a third electrically conductive material to at least partially fill the opening for the TSV.

Example 19 provides the method according to example 18, further including providing a liner of a dielectric material on the sidewalls and the bottom of the opening for the decoupling capacitor before providing the first capacitor electrode.

Example 20 provides the method according to examples 18 or 19, where the opening for the TSV extends from a front side of the support structure towards, but not reaching, a back side of the support structure, and the method further includes thinning the back side of the support structure to expose the third electrically conductive material from the back side.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a support structure, having a first side and a second side, opposite the first side;
a through-silicon via (TSV), extending between the first side and the second side;
a decoupling capacitor having a first capacitor electrode, a second capacitor electrode, and a capacitor insulator between the first capacitor electrode and the second capacitor electrode;
a liner of a dielectric material on sidewalls of the TSV; and
a liner of the dielectric material on sidewalls of the decoupling capacitor,
wherein:
the first capacitor electrode is a liner of a first electrically conductive material on sidewalls and a bottom of an opening in the support structure, the opening in the support structure extending from the second side towards, but not reaching, the first side,
the capacitor insulator is a liner of a capacitor insulator material on sidewalls and a bottom of the opening in the support structure lined with the first electrically conductive material,
the second capacitor electrode is a second electrically conductive material filling at least a portion of the opening in the support structure lined with the first electrically conductive material and with the capacitor insulator material, and
the liner of the dielectric material on sidewalls of the decoupling capacitor is between the first electrically conductive material and the sidewalls and the bottom of the opening in the support structure.

2. The IC structure according to claim 1, wherein a depth of the opening in the support structure is between about 1 and 25 micrometers.

3. The IC structure according to claim 1, a depth of the opening in the support structure is between about 1.1 and 4 times smaller than a distance between the first side and the second side.

4. The IC structure according to claim 1, wherein a width of the opening in the support structure is between about 250 and 5000 nanometers.

5. The IC structure according to claim 1, wherein a thickness of the liner of the first electrically conductive material is between about 10 and 70 nanometers.

6. The IC structure according to claim 1, wherein a thickness of the liner of the capacitor insulator material is between about 1 and 7 nanometers.

7. The IC structure according to claim 1, further comprising:
   a first interconnect coupled to the first capacitor electrode, and
   a second interconnect coupled to the second capacitor electrode.

8. The IC structure according to claim 1, wherein each of a thickness of the liner of the dielectric material on the sidewalls of the TSV and a thickness of the liner of the dielectric material on the sidewalls of the decoupling capacitor is between about 100 and 7000 nanometers.

9. The IC structure according to claim 1, wherein the dielectric material is silicon oxide or silicon nitride.

10. The IC structure according to claim 1, wherein the capacitor insulator material includes one or more of hafnium oxide, silicon oxide, silicon nitride, silicon oxynitride, silicon oxycarbide nitride, silicon oxycarbide, titanium oxide, zirconium oxide, tin oxide, aluminum oxide, silicon nitride, and aluminum nitride.

11. An integrated circuit (IC) package, comprising:
   an IC die having a first side and a second side, opposite the first side; and
   a further IC component, coupled to the IC die,
   wherein:
      a through-silicon via (TSV) extends between the first side and the second side,
      the IC die includes a decoupling capacitor having a first capacitor electrode, a second capacitor electrode, and a capacitor insulator between the first capacitor electrode and the second capacitor electrode,
      the first capacitor electrode is a liner of a first electrically conductive material on sidewalls and a bottom of an opening in the IC die, the opening in the IC die extending from the second side towards, but not reaching, the first side of the IC die,
      the capacitor insulator is a liner of a capacitor insulator material on sidewalls and a bottom of the opening in the IC die lined with the first electrically conductive material,
      the second capacitor electrode is a second electrically conductive material filling at least a portion of the opening in the IC die lined with the first electrically conductive material and with the capacitor insulator material,
      the TSV is at least partially filled with a third electrically conductive material, and
      the IC die further includes a liner of a dielectric material on sidewalls of the TSV and a liner of the dielectric material on the sidewalls of the opening in the IC die, wherein the liner of the dielectric material on the sidewalls of the opening in the IC die is between the sidewalls of the opening in the IC die and the liner of the first electrically conductive material.

12. The IC package according to claim 11, a depth of the opening in the IC die is between about 1.1 and 4 times smaller than a distance between the first side and the second side of the IC die.

13. The IC package according to claim 11, wherein the further component is one of a package substrate, a flexible substrate, or an interposer.

14. The IC package according to claim 11, wherein the further component is coupled to the IC die via one or more first level interconnects.

15. The IC package according to claim 14, wherein the one or more first level interconnects include one or more solder bumps, solder posts, or bond wires.

16. A method for fabricating an integrated circuit (IC) structure, the method comprising:
   providing, in a support structure, an opening for a through-silicon via (TSV) and an opening for a decoupling capacitor, wherein a depth of the opening for the decoupling capacitor is between about 1.1 and 4 times smaller than a depth of the opening for the TSV;
   providing a first capacitor electrode of the decoupling capacitor as a liner of a first electrically conductive material on sidewalls and a bottom of the opening for the decoupling capacitor;
   providing a capacitor insulator of the decoupling capacitor as a liner of a capacitor insulator material on sidewalls and a bottom of the opening for the decoupling capacitor lined with the first electrically conductive material;
   providing a second capacitor electrode of the decoupling capacitor by providing a second electrically conductive material filling at least a portion of the opening for the decoupling capacitor lined with the first electrically conductive material and with the capacitor insulator material;
   providing a third electrically conductive material to at least partially fill the opening for the TSV;
   providing a liner of a dielectric material on the sidewalls and the bottom of the opening for the decoupling capacitor before providing the first capacitor electrode; and
   providing a liner of the dielectric material on sidewalls of the opening for the TSV before providing the third electrically conductive material to at least partially fill the opening for the TSV.

17. The method according to claim 16, wherein the opening for the TSV extends from a front side of the support structure towards, but not reaching, a back side of the support structure, and the method further includes thinning the back side of the support structure to expose the third electrically conductive material from the back side.

\* \* \* \* \*

UNITED STATES PATENT AND TRADEMARK OFFICE
CERTIFICATE OF CORRECTION

| | |
|---|---|
| PATENT NO. | : 11,923,150 B2 |
| APPLICATION NO. | : 16/884094 |
| DATED | : March 5, 2024 |
| INVENTOR(S) | : Changyok Park et al. |

It is certified that error appears in the above-identified patent and that said Letters Patent is hereby corrected as shown below:

In the Claims

In Column 20, Claim 3, Line 55, delete "a depth" and insert -- wherein a depth --, therefor.

In Column 22, Claim 12, Line 1, delete "a depth" and insert -- wherein a depth --, therefor.

Signed and Sealed this
Twenty-fourth Day of September, 2024

Katherine Kelly Vidal
*Director of the United States Patent and Trademark Office*